(12) United States Patent
Jiawook

(10) Patent No.: US 9,117,954 B2
(45) Date of Patent: Aug. 25, 2015

(54) HIGH EFFICIENCY NANOSTRUCTURED PHOTOVOLTAIC DEVICE MANUFACTURING

(75) Inventor: Rizgar Jiawook, Bunkeflostrand (SE)

(73) Assignee: European Nano Invest AB, Malmo (SE)

( * ) Notice: Subject to any disclaimer, the term of this patent is extended or adjusted under 35 U.S.C. 154(b) by 406 days.

(21) Appl. No.: 13/574,840

(22) PCT Filed: Mar. 9, 2011

(86) PCT No.: PCT/EP2011/053545
§ 371 (c)(1),
(2), (4) Date: Jul. 24, 2012

(87) PCT Pub. No.: WO2011/110596
PCT Pub. Date: Sep. 15, 2011

(65) Prior Publication Data
US 2012/0291862 A1    Nov. 22, 2012

Related U.S. Application Data

(60) Provisional application No. 61/311,811, filed on Mar. 9, 2010.

(51) Int. Cl.
*H01L 33/04*  (2010.01)
*H01L 31/0352*  (2006.01)
(Continued)

(52) U.S. Cl.
CPC ........ *H01L 31/056* (2014.12); *H01L 31/02168* (2013.01); *H01L 31/02363* (2013.01);
(Continued)

(58) Field of Classification Search
CPC .............. H01L 31/0216; H01L 31/02168; H01L 31/0236; H01L 31/035218; H01L 33/06; H01L 33/22

USPC ................... 136/244, 252, 256, 258
See application file for complete search history.

(56) References Cited

U.S. PATENT DOCUMENTS 6,690,845 B1 * 2/2004 Yoshimura et al. ............. 385/14
2007/0085100 A1   4/2007 Diana et al.
(Continued)

FOREIGN PATENT DOCUMENTS

WO    2008/137995    11/2008

OTHER PUBLICATIONS

International Search Report for corresponding International Application No. PCT/EP2011/053545 dated May 30, 2012.
(Continued)

*Primary Examiner* — Susan D Leong
(74) *Attorney, Agent, or Firm* — Renner, Otto, Boisselle, Sklar, LLP

(57) ABSTRACT

Photovoltaic and Light emitted diode devices comprise of epitaxial wafer of plurality of layers has been proposed. Quantum Dots are deposited onto the micro-nanostructure layer from the light incident direction to increasing light transmission to the active layer. Quantum dots deposited between the light source and the active layer, on the micro-nanostructure layer, to improve light excitation, since it can absorb wavelengths, which are not absorbed by the active layer, and the size and composition of quantum dots can determine its bandgap. A micro-nanostructured layer at the bottom of the PV wafer, which is produced by Molecular Beam Epitaxy (MBE), increases the internal light reflections in the active layer, which increases the efficiency of light absorption and that leads to a photocurrent enhancement.

20 Claims, 2 Drawing Sheets

(51) Int. Cl.
- *H01L 31/056* (2014.01)
- *H01L 31/0216* (2014.01)
- *H01L 31/055* (2014.01)
- *H01L 33/40* (2010.01)
- *H01L 33/50* (2010.01)
- *H01L 31/0236* (2006.01)
- *H01L 33/22* (2010.01)

(52) U.S. Cl.
CPC ...... *H01L31/035218* (2013.01); *H01L 31/055* (2013.01); *H01L 33/405* (2013.01); *H01L 33/502* (2013.01); *H01L 33/22* (2013.01); *Y02E 10/52* (2013.01)

(56) References Cited

U.S. PATENT DOCUMENTS

| | | |
|---|---|---|
| 2008/0130120 A1 | 6/2008 | Hsu et al. |
| 2008/0216894 A1 | 9/2008 | Hammond |
| 2009/0079034 A1 | 3/2009 | Wang |
| 2009/0084963 A1 | 4/2009 | Kost |
| 2009/0152664 A1* | 6/2009 | Klem et al. .......... 257/440 |
| 2009/0255580 A1 | 10/2009 | Dasgupta et al. |

OTHER PUBLICATIONS

Chanyawadee et al., "Photocurrent Enhancement in Hybrid Nanocrystal Quantum-Dot *p-i-n* Photovoltaic Devices", Physical Review Letters, PRL 102, 2009, pp. 077402-1-077402-4.

Chanyawadee et al., "Efficient light harvesting in hybrid CdTe nanocrystal/bulk GaAs *p-i-n* photovoltaic devices", Applied Physics Letters, vol. 94, 2009, pp. 233502-1-233502-3.

Sheu et al., "Demonstration of GaN-Based Solar Cells With GaN/InGaN Superlattice Absorption Layers", IEEE Electron Device Letters, vol. 30, No. 3, Mar. 2209, pp. 225-227.

Lin et al., "Optimization of random diffraction gratings in the thin-film solar cells using genetic algorithms", Solar Energy Materials & Solar Cells, vol. 92, 2008, pp. 1689-1696.

* cited by examiner

HIGH EFFICIENCY NANOSTRUCTURED PHOTOVOLTAIC DEVICE MANUFACTURING

This application is a national phase of International Application No. PCT/EP2011/053545 filed Mar. 9, 2011 and published in the English language, which claims priority to U.S. 61/311,811 filed Mar. 9, 2010.

FIELD OF INVENTION

The present invention relates generally to photovoltaic and Light emitted diode device manufacturing, using micro and nano-scale structure layers, depositing Quantum Dots onto the micro-nanostructures and using nonradiative energy transfer for energy conversion.

BACKGROUND OF PRIOR ART

Photovoltaic is the field of technology, which directly converts sunlight to electricity. The solar cell is the elementary building block of the photovoltaic (PV) technology. Solar cells are made of semiconductor materials, such as silicon. One of the properties of the semiconductors that makes them most useful is that their conductivity may easily be modified by introducing impurities into their crystal lattice. On one side of the cell the impurities, which are phosphorus atoms with five valence electrons, on the other side, atoms of boron with three valence electrons create a greater affinity than silicon to attract electrons.

The layers of the photovoltaic cells made of semiconductor materials, which should be light responsive. The materials include Group I-III-VI, Group IV and Group III-V, as well as II-VI semiconductor materials, such as CdTe, CdSe, CdS, CdO, ZnS, and so on.

Chanyawadee, S. et al, fabricate a hybrid nanocrystal quantum-dot patterned p-i-n structure that utilizes nonradioactive energy transfer from highly absorbing colloidal nanocrystal quantum dots to a patterned semiconductor slab to demonstrate a six fold increase of the photocurrent conversion efficiency compared to the bare p-i-n semiconductor device. The heterostructure was grown by molecular beam epitaxy on a (100) GaAs substrate in a p-i-n configuration that consists of 20 periods of 7.5 nm thick GaAs quantum wells with 12 nm thick AlGaAs barriers, (Physical Review Letters, 102, 077402, 2009.

In another article by Chanyawadee, S. et al, (Applied Physics Letters, 94, 233502, 2009), demonstrate photocurrent enhancement of a hybrid PV device consisting of highly absorbing colloidal Nanocrystals (NC) and a patterned bulk p-i-n heterostructure at both low 25 K and room temperature. The patterning is designed to bring the colloidal NCs into close proximity with the intrinsic region of the p-i-n heterostructure so that the excitation energy of the deposited NCs is efficiently transferred to the patterned bulk p-i-n heterostructure by means of nonradiative energy transfer. This hybrid NC/bulk p-i-n device offers about two orders of magnitude higher photocurrent than the hybrid NC/Quantum Well p-i-n PV device from their previous work above and releases the potential of high efficiency PV cells and optoelectronic devices.

Kiravittaya, S. et al, proposes Quantum Dots (QD) using InGaAs on InAs of size 40-50 nm in diameter and 4-7 nm in height to be used for PV applications because of its wider spectral response, better temperature stability and possibility of carrier storage feature, (PV Conference 2000, 28$^{th}$ IEEE Conf., P 818-821, 2000).

Patent application (WO 2008/137995) discloses an improved photovoltaic devices and methods. A photovoltaic device includes a semiconductor layer and a light-responsive layer which form a junction, such as a p-n junction. The light-responsive layer can include a plurality of carbon nanostructures, such as carbon nanotubes, located therein. In many cases, the carbon nanostructures can provide a conductive pathway within the light-responsive layer. In other photovoltaic devices include semiconductor nanostructures, which can take a variety of forms, in addition to the carbon nanostructures. Methods of fabricating photovoltaic devices are also disclosed.

Another Patent application US 2008/0216894 A1 suggests Nanostructures and quantum dots are used in photovoltaic cells or solar cells outside of the active layer to improve efficiency and other solar cell properties. In particular, organic photovoltaic cells can benefit. The quantum dot layer can be found between the light source and the active layer or on the side of the active layer opposite the light source. Quantum dots can also be used in electrode layers.

A prior art suggests several QD layers to be deposited in the active layer of the solar cell having several bandgaps and Fermi levels. Particularly, the size and composition of a QD can determine its bandgap and Fermi level, (US 2009/0255580 A1).

Patent application (US 2008/0130120 A1) suggests nanostructured layers absorbing IR and/or UV in a photovoltaic device increases efficiency of solar cells. The nanostructure materials are integrated with one or more of: crystalline silicon (single crystal or ponlycrystalline) solar cells and thin film (amorphous silicon, microcrystalline silicon, CdTe, CIGS and III-V materials) solar cells whose absorption is primarily in the visible region. The nanoparticle materials are comprised of quantum dots, rods or multipods of various sizes.

DETAILED DESCRIPTION

An electrode system comprising anode and cathode, and photovoltaic device comprise an active layer, where light energy is absorbed and converted to electrical energy, as well as, if needed a mechanical support system like a substrate and other optional layers like hole injection layers, hole transport layers, additional substrates, reflective layers, encapsulants, barriers, adhesives, and the like. The photovoltaic device can comprise organic active layer components, or can be a hybrid.

The quantum dot layer comprises one or more nanoparticle. The quantum dots in the layer can be the same material or can be mixtures of different materials including two or more materials. For example, the quantum dot layer can comprise of three different quantum dot materials or more. The different dots function together to produce a desired result. The quantum dots in the layer can be the same size or can be mixture of various sizes. Different particles can be combined to provide mixtures. Particle sizes and particle size distributions provide the desired fluorescent properties of light absorption and light emission, functioning together with the light absorption of the active layer. Particle size can be based on a variety of quantum dot. The optical absorption and emission can be shifted to the blue with decreasing particle size. Quantum dots can exhibit broad absorption of high-energy or blue, and UV light energy, and narrower emission to the red of the wavelength of absorption.

The incident radiation upon the quantum dot layer is red-shifted to form red-shifted radiation, and an active layer which absorbs red-shifted radiation. Red-shifting by quantum dots is known. Nanostructures are generally known in the art, and quantum dots are also generally known in the art and can be distinguished from quantum wells and quantum wires. Nanostructures can comprise nanoparticle. Nanostructures can exhibit fluorescent properties and comprise fluorophores.

The quantum dots can be inorganic materials, metallic materials, and can be semiconductor materials including, and not limited to, for example elements from Group II, Group III, Group IV, Group V, or Group VI including II-VI and III-V materials. Examples include CdS, CdSe, CdTe, InP, InAs, ZnS, ZnSe, HgTe, GaN, GaP, GaAs, GaSb, InSb, Si, Ge, AlAs, AlSb, PbSe, PbS, and PbTe. Further example, InGaAs and InGaN, AlInGaP. In particular, quantum dots which absorb the UV and blue light range emit in the visible or near infrared, and particularly, CdS and CdSe can be used.

The layer comprising quantum dots can absorb radiation of a first wavelength range and may exhibit a peak or maximum absorption, in some limited cases, as well as peaks on shoulders, overlapping peaks, and cutoff wavelengths. Wavelength ranges for absorption can be determined by methods known in the art. The first wavelength range can include absorption bands consistent with efficient solar energy collection and conversion to electric power. The quantum dot layer can have an absorption peak at about 250 nm to about 2800 nm. The range of desired absorption wavelengths and peaks in any given device may span on any range within the above limits.

The quantum dots layer in general can be adapted to absorb light which is not absorbed by the active layer. For example, the active layer may absorb light in the red or near infrared and the quantum dot layer can absorb at shorter and higher energy or wavelengths. The quantum dot layer can then reemit radiation in the abruption spectra for the active layer. The maximum emission wavelength of the quantum dot can be chosen to overlap with the maximum absorption wavelength of the active layer.

Quantum dots can be used in colloidal forms using wet chemical methods including with carrier solvents. Homogeneous nucleation in a fluid solvent can be carried out. Alternatively, quantum dots can be formed by making a thin film (e.g., by molecular beam epitaxy (MBE) or chemical vapor deposition (CVD)) and heating to convert the film to dot form, or alternatively by nanolithography. Many existing techniques face difficulties with exciton recombination, charge transport, and limited device efficiency. The present invention is directed to a nanostructure layers and quantum dot on an epitaxial wafer having greater efficiency.

In the present invention, quantum dots are used onto a very thin nanostructure layer near the active material in the photovoltaic cell for harvesting more light to convert photons into charge carriers. Quantum dots have many desirable physical properties in photovoltaics, such as a tunable bandgap and Fermi level. A quantum dot's bandgap can be much different from the bulk material due to the small size of the quantum dot. In general, the bandgap of a quantum dot is inversely related to the quantum dot size, thereby quantum dots can be tuned to have the desired bandgaps.

It is important to note that the size of a quantum dot also determines its Fermi level. Similar to the bandgap, the location of the Fermi level of a quantum dot is inversely related to the quantum dot size; quantum dots of smaller sizes generally have higher Fermi levels than larger quantum dots of the same composition.

The photovoltaic device includes QD deposited on the first nanostructure layer, a first conductor layer, a second conductor layer, an active layer and a second nanostructure layer. The first and second conducting layers can be any material suitable for conducting charges (e.g. electrons, holes, or any other charge carriers). In operation, a photon is absorbed in the active layer and dissociates at least one excite, thereby creating pairs of charge carriers. The charge carriers are transported to the first and second conductor layers. The first conductor layer and the first nanostructure layer allowing the photon to pass through it and be absorbed in the active layer. Additionally, the second conductor layer can be optically reflective to increase the probability that the photon will interact with the active layer.

Methods utilized for growing high quality flat and thick compound semiconductors onto foreign substrates using nanostructure compliant layers. These methods uses structures of substantially constant diameter along the majority of their length like nanorods, or other structures that vary in diameter along their dimensions like pyramids, cones or spheroids. Nanorods of semiconductor materials can be grown on any foreign substrates by molecular beam epitaxy (MBE), chemical vapor deposition (CVD), metalorganic chemical vapor deposition (MOCVD), metalorganic vapor phase epitaxy (MOVPE) or hydride-vapor phase epitaxy (HVPE) methods. Such nanorods may typically have a diameter of about 10 to 120 nm. Further growth of continuous compound semiconductor thick films or wafer can be achieved by epitaxial lateral overgrowth. The topography of nanorods with a narrow air gap permits coalescence with a very thin overgrown layer. Typically only 0.2 μm thicknesses are required for continuous overgrown layer. For example, the use of GaN nanorods as the compliant layer to grow thick GaN has several advantages. The stress and dislocations are mostly localized in the interface between the GaN nanorods and the substrate. Thus growth leads to the top part of the GaN nanorods being nearly free of stress and dislocations. A high-quality thick GaN can therefore be grown on this nanorods compliant layer, and has very little tilting in the coalesced front either on top of the nanorods or on top of the air gap. A protection area on the wafer's edge has been introduced to reduce the overall stress of the surface in the process of the fabrication of epitaxial growth wafer, and that is the epitaxial growth will happen only on the nanostructured area of the wafer producing a stress free epitaxial wafer.

GaN nanorods with their inbuilt flexibility, due to their aspect ratio and nano-dimensions, will develop minimal internal stress. In order to separate the thick GaN from the substrate with ease and reproducibility, an AlN nucleation layer, under tensile stress, with a critical dimension may be used. Rapid cooling or mechanical twisting will push the local stress to exceed the critical value to separate the thick film. An alternative method of separating the GaN from the substrate is using anodic electrochemical etching. To perform this method, a thin p-GaN layer to be grown on top of the nanorods before the epitaxial lateral overgrowth for thick GaN. A suitable electrolyte and bias voltage results in p-GaN being selectively etched off, to leave the n-GaN untouched.

The above method is utilized to provide a PV wafer. It is produced by growing an epitaxial initiating growth surface onto a nanostructured substrate, and then grows a semiconductor material, e.g., but not limited to, Si, GaAs, InP onto the nanostructure using epitaxial lateral overgrowth of thickness 20-50 micrometers. Separate the grown semiconductor material from the substrate. Provide a nanostructure onto the semiconductor material using nanoimprint lithography methods.

The quantum dot composition is selected from the group consisting of PbS, PbSe, PbTe, CdS, CdSe, CdTe, HgTe, HgS, HgSe, ZnS, ZnSe, InAs, InP, GaAs, GaP, AlP, AlAs, Si, and Ge. More generally, the quantum dots can comprise metallic quantum dots, semiconducting quantum dots, or any combination thereof.

As one of ordinary skill in the art will appreciate, various changes, substitutions, and alterations could be made or otherwise implemented without departing from the principles of the present invention, e.g. other materials not listed herein can be used for the various layers and quantum dots.

SUMMARY OF THE INVENTION

A photovoltaic device comprising an epitaxial wafer comprises of a plurality of layers, wherein said wafer is epitaxial grown material includes but not limited to InP, InAs, ZnS, ZnSe, GaN, GaP, GaAs, GaSb, InSb, Si, SiC, Ge, AlAs, AlSb, PbSe, PbS, PbTe, InGaAs, InGaN and AlInGaP, wherein the said wafer is epitaxial grown on a nano-structured surface where a space in the outer edge of the surface is protected in order to limit the epitaxial growth on the outer edge, wherein the said wafer is epitaxial grown on a nano-structured surface to thickness 20-100 micrometers, wherein the said epitaxial grown wafer will be separated from the nano-structured surface, a first nanostructure layer with quantum dots, having different compositions and having different sizes, wherein the said nanostructure layers are produced using nanoimprint lithography methods wherein a plurality of said quantum dots deposited onto the said first nanostructure layer which increases the radiation absorption from the incident solar spectrum, a first conductive layer, wherein the said quantum dots can be inorganic materials, metallic materials, and semiconductor materials including, elements from Group II, Group III, Group IV, Group V, or Group VI including II-VI and III-V materials, wherein the materials of the said groups includes but not limited to, CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN and AlInGaP, an active layer comprises of at least one np-junction, which can be multi-junction, which is situated between the said first and second conductive layers comprises of material exhibiting absorption of radiation, a second conductive layer, and a second nanostructured layer, wherein the said second nanostructure layer situated at the bottom of the photovoltaic cell, which increases the internal reflection inside the substrate and the nanostructure surfaces are structured by a nanoimprint lithography method;

A light emitting device comprising an epitaxial wafer comprises of a plurality of layers, wherein said wafer is epitaxial grown material includes but not limited to InP, InAs, ZnS, ZnSe, GaN, GaP, GaAs, GaSb, InSb, Si, SiC, Ge, AlAs, AlSb, PbSe, PbS, PbTe, InGaAs, InGaN and AlInGaP, wherein the said wafer is epitaxial grown on a nano-structured surface where a space in the outer edge of the surface is protected in order to limit the epitaxial growth on the outer edge, wherein the said wafer is epitaxial grown on a nano-structured surface to thickness 20-100 micrometers, wherein the said epitaxial grown wafer will be separated from the nano-structured surface, a first nanostructure layer with quantum dots having different compositions and having different sizes, wherein the said nanostructure layers are produced using nanoimprint lithography methods, wherein a plurality of said quantum dots deposited onto the said first nanostructure layer for purpose of non-radiative energy transfer in color-conversion emission, a first conductive layer, wherein the said quantum dots can be inorganic materials, metallic materials, and semiconductor materials including, elements from Group II, Group III, Group IV, Group V, or Group VI including II-VI and III-V materials, wherein the materials of the said groups includes but not limited to, CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN and AlInGaP, an active layer comprises of at least one np-junction, which can be multi-junction, which is situated between the said first and second conductive layers comprises of material exhibiting excitation of radiation, a second conductive layer, and a second nanostructured layer, wherein the said second nanostructure layer situated at the bottom of the device, which increases the reflection from the backside of the substrate and the nanostructure surfaces are structured by a nanoimprint lithography method.

Figure 1:
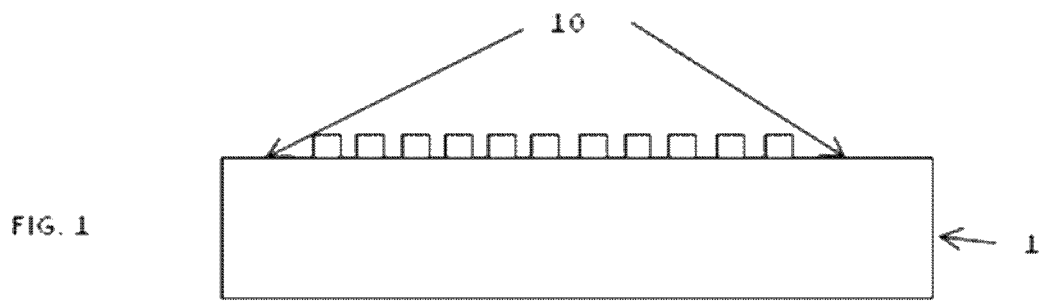
FIG. 1: Structured Silicon Substrate (1), and a protection area (10).
Figure 2:
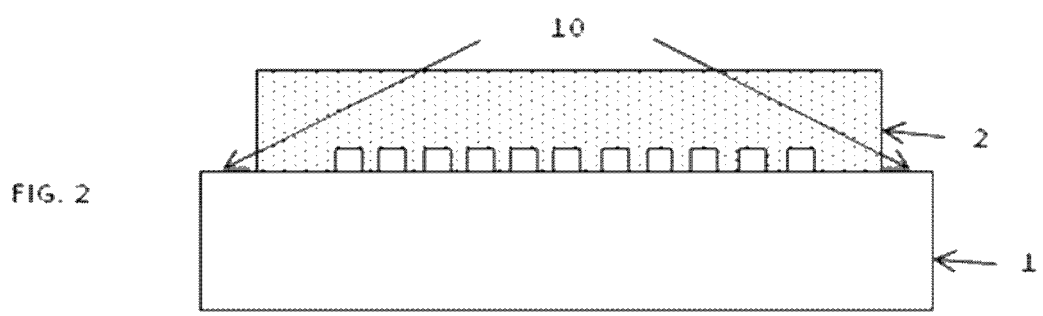
FIG. 2: Epitaxial Wafer (2) Grown on top of the Structured Substrate (1) having a protection area (10).
Figure 3:
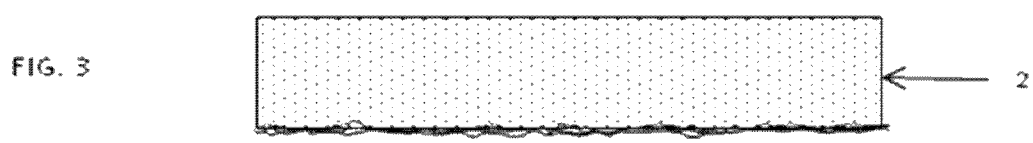
FIG. 3: The Epitaxial Wafer (2).
Figure 4:
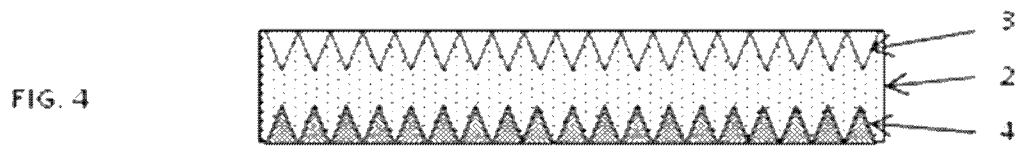
FIG. 4: Using NIL for producing Nanostructure layers (3, 4) on the top and the bottom of the Epitaxial Wafer (2).
Figure 5:
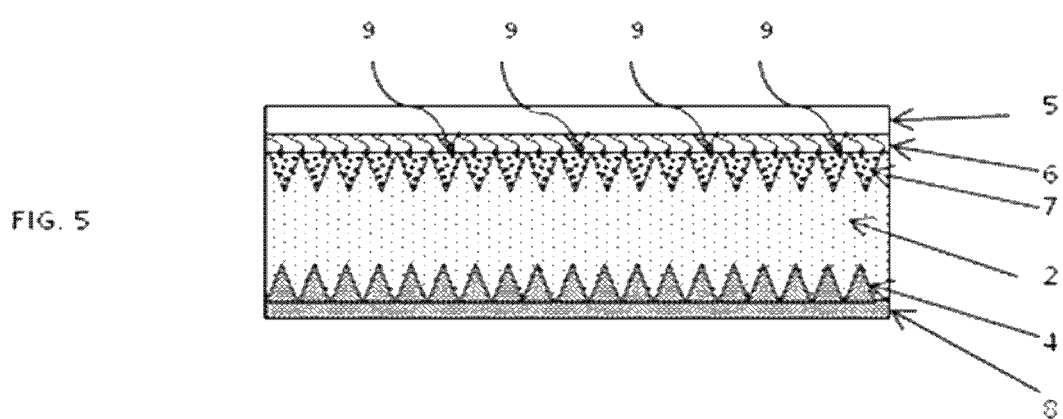
FIG. 5: Finished device comprises of plurality of layers: Protective Glass Layer (5), First Conductive Layer (6), First Nanostructure Layer (3) using NIL and QDs (7), The Epitaxial Wafer, including n-p Active Layer (2), Second Nanostructure Layer (4), Second Conductive Layer (8), and the light radiation (9).
Figure 6:
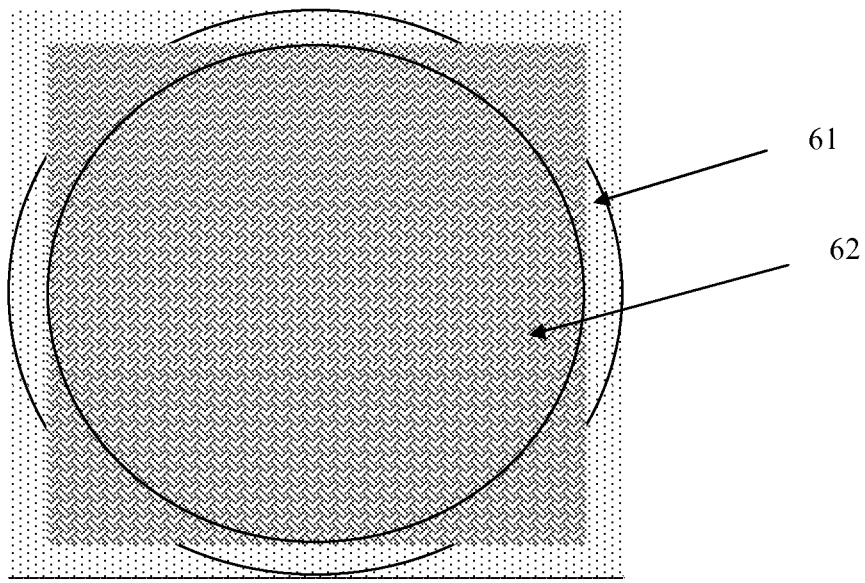
FIG. 6: Shows surface (silicon substrate) structured only partially (62) and outer area left unstructured (61). The epitaxial growth will happen only on the nanostructured area (62) of the wafer producing a stress free epitaxial wafer.

The invention claimed is:
1. A photovoltaic device comprising:
A first conductive layer;
A second conductive layer;
An epitaxial grown wafer comprising an active layer, the epitaxial grown wafer situated between the first and the second conductive layers, wherein the active layer comprises at least one np junction and comprises material exhibiting absorption of radiation;
A first nanostructured layer situated between the first conductive layer and the epitaxial grown wafer, the first nanostructured layer having a plurality of quantum dots deposited on the surface thereof proximate to the active layer, wherein the plurality of quantum dots increases the radiation absorption from incident solar spectrum for converting more photons into charge carriers; and
A second nanostructured layer situated between the second conductive layer and the epitaxial grown wafer, wherein the second nanostructure layer increases the internal reflection inside the active layer.
2. A light emitting device comprising:
A first conductive layer;
A second conductive layer;
An epitaxial grown wafer comprising an active layer, the epitaxial grown wafer situated between the first and the second conductive layers, wherein the active layer comprises at least one np junction and comprises material exhibiting absorption of radiation;
A first nanostructured layer situated between the first conductive layer and the epitaxial grown wafer, the first nanostructured layer having a plurality of quantum dots deposited on the surface thereof proximate to the active layer, wherein the plurality of quantum dots increases the radiation absorption from incident solar spectrum for converting more photons into charge carriers; and
A second nanostructured layer situated between the second conductive layer and the epitaxial grown wafer, wherein the second nanostructure layer increases the internal reflection inside the active layer.

3. The device according to claim 1, wherein the quantum dots have different compositions.

4. The device according to claim 1, wherein the quantum dots have different sizes.

5. The device according to claim 1, wherein the nanostructure layers are produced using nanoimprint lithography methods.

6. The device according to claim 1, wherein the quantum dots are chosen from among inorganic materials, metallic materials, and semiconductor materials including, elements from Group II, Group III, Group IV, Group V and Group VI materials.

7. The device according to claim 1, wherein the quantum dots are chosen from among CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN and AlInGaP.

8. The device according to claim 1, wherein the np-junction is multi-junction.

9. The device according to claim 1, wherein the wafer is an epitaxial grown material chosen from among InP, InAs, ZnS, ZnSe, GaN, GaP, GaAs, GaSb, InSb, Si, SiC, Ge, AlAs, AlSb, PbSe, PbS, PbTe, InGaAs, InGaN and AlInGaP.

10. The device according to claim 1, wherein the wafer is epitaxial grown on a nano-structured surface of a substrate to a thickness of 20-100 micrometers.

11. The device according to claim 10, wherein the wafer is epitaxial grown on a nano-structured surface of a substrate having an outer edge, where a space in the outer edge of the substrate surface is protected in order to limit the epitaxial growth on the outer edge.

12. The device according to claim 11, wherein the epitaxial grown wafer is separated from the nano-structured surface of the substrate.

13. The device according to claim 11, wherein the nanostructure surfaces are structured by a nanoimprint lithography method.

14. The device according to claim 2, wherein the quantum dots have different compositions.

15. The device according to claim 2, wherein the quantum dots have different sizes.

16. The device according to claim 2, wherein the nanostructure layers are produced using nanoimprint lithography methods.

17. The device according to claim 2, wherein the quantum dots are chosen from among inorganic materials, metallic materials, and semiconductor materials including, elements from Group II, Group III, Group IV, Group V and Group VI materials.

18. The device according to claim 2, wherein the quantum dots are chosen from among CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN and AlInGaP.

19. The device according to claim 2, wherein the np-junction is multi-junction.

20. The device according to claim 2, wherein the wafer is an epitaxial grown material chosen from among InP, InAs, ZnS, ZnSe, GaN, GaP, GaAs, GaSb, InSb, Si, SiC, Ge, AlAs, AlSb, PbSe, PbS, PbTe, InGaAs, InGaN and AlInGaP.

* * * * *